United States Patent
Maier et al.

(10) Patent No.: US 11,424,842 B2
(45) Date of Patent: Aug. 23, 2022

(54) SIGNAL ANALYSIS METHOD AND SIGNAL ANALYSIS MODULE

(71) Applicant: Rohde & Schwarz GmbH & Co. KG, Munich (DE)

(72) Inventors: Andreas Maier, Munich (DE); Mathias Hellwig, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 64 days.

(21) Appl. No.: 17/025,720

(22) Filed: Sep. 18, 2020

(65) Prior Publication Data

US 2022/0094452 A1    Mar. 24, 2022

(51) Int. Cl.
*H04B 17/30* (2015.01)
*H04L 7/00* (2006.01)
*H04L 1/20* (2006.01)

(52) U.S. Cl.
CPC ............ *H04B 17/30* (2015.01); *H04L 1/205* (2013.01); *H04L 7/0054* (2013.01)

(58) Field of Classification Search
None
See application file for complete search history.

(56) References Cited

U.S. PATENT DOCUMENTS

| 2005/0163207 | A1* | 7/2005 | Buckwalter | ....... H04L 25/03878 |
| | | | | 375/229 |
| 2007/0201595 | A1* | 8/2007 | Stimple | .................. H04W 8/26 |
| | | | | 375/376 |
| 2013/0265851 | A1* | 10/2013 | Faber | ...................... G01V 1/288 |
| | | | | 367/25 |

* cited by examiner

*Primary Examiner* — Adolf Dsouza
(74) *Attorney, Agent, or Firm* — Christensen O'Connor Johnson Kindness PLLC

(57) ABSTRACT

A signal analysis method is described. The signal analysis method includes: receiving a time-and-value discrete input signal, the input signal being associated with a signal source; determining at least one jitter component of the input signal; determining a step response based on the input signal, the step response being associated with at least the signal source; determining a counter function based on the step response, the counter function being configured to cancel error terms in a finite-time transform of the step response to frequency domain; superposing the step response and the counter function, thereby obtaining a modified step response; and transforming the modified step response to frequency domain, thereby obtaining a transfer function being associated with at least the signal source. Further, a signal analysis module for analyzing a time-and-value discrete input signal being associated with a signal source is described.

20 Claims, 4 Drawing Sheets

SIGNAL ANALYSIS METHOD AND SIGNAL ANALYSIS MODULE

FIELD OF THE DISCLOSURE

Embodiments of the present disclosure generally relate to a signal analysis method. Embodiments of the present disclosure further relate to a signal analysis module comprising one or more circuits for analyzing a time-and-value discrete input signal being associated with a signal source.

BACKGROUND

For jitter analysis, the components of jitter such as Data Dependent Jitter (DDJ), Periodic Jitter (PJ), Other Bounded Uncorrelated Jitter (OBUJ) and Random Jitter (RJ) must be separated and the bit error rate (BER) must be calculated.

So far, techniques are known that exclusively relate to determining the Time Interval Error (TIE) of the Total Jitter (TJ). In fact, the causes of the different jitter types lead to a distortion of the received signal and they, therefore, have an influence on the TIE via the received signal. Accordingly, the respective components of jitter are calculated once the Time Interval Error (TIE) of the Total Jitter (TJ) is determined.

For example, jitter analysis is an important task for characterizing high-speed interfaces like PCIe, USB, SATA, or HDMI. Signal integrity is an important part of this characterization, and one challenge is to connect the device under test (DUT) properly to the measurement equipment, which could be an oscilloscope, a spectrum analyzer, or a vector network analyzer.

Typically, these DUT interfaces are designed for consumer products and have low cost commercial connectors with undefined radio frequency (RF) characteristics. Therefore, a test fixture is required to bridge between the interfaces and the measurement equipment, but these test fixtures influence the measurement itself and may cause errors that cannot be neglected. De-embedding techniques would be an option, but the characterization of the test fixtures is a challenge.

Accordingly, there is a need for a signal analysis method as well as a signal analysis module that allow for a correct characterization of the influence of connecting interfaces on a signal that is to be analyzed.

SUMMARY

Embodiments of the present disclosure provide a signal analysis method. In an embodiment, the signal analysis method comprises the following steps:
receiving a time-and-value discrete input signal, the input signal being associated with a signal source;
determining at least one jitter component of the input signal;
determining a step response based on the input signal, the step response being associated with at least the signal source;
determining a counter function based on the step response, the counter function being configured to cancel error terms in a finite-time transform of the step response to frequency domain;
superposing the step response and the counter function, thereby obtaining a modified step response; and
transforming the modified step response to frequency domain, thereby obtaining a transfer function being associated with at least the signal source.

Therein and in the following, the term "receiving a time-and-value discrete input signal" is understood to mean that the input signal is received and the subsequent steps are performed in real-time, or that the time-and-value discrete input signal is stored in a memory and the subsequent steps are performed based on the stored samples of the (analog) input signal. Accordingly, the time-and-value discrete input signal may be stored (digitally) in a memory and read from the memory for further processing. Alternatively, an analog input signal may be measured and digitized, thereby obtaining the time-and-value discrete input signal.

Moreover, the term "signal source" is understood to denote all components from the actual source generating the input signal up to a signal analysis module being configured to perform the steps described above. In some embodiments, the term "signal source" is understood to comprise test fixtures, connecting interfaces, cables etc. that are used to connect a device under test to a measurement instrument.

Further, the term "determining a step response" encompasses an estimation of the step response.

In general, the transfer function comprises information on data dependent disturbances that are associated with the signal source, for example information on data dependent jitter being associated with the signal source.

Accordingly, the signal analysis method according to the present disclosure provides additional information on the data dependent disturbances comprised in the input signal, for example on data dependent jitter comprised in the input signal.

Only a finite amount of sample points of the input signal is available for determining the step response, for example for estimating the step response. Thus, a direct transform of the step response to frequency domain may result in sizable errors originating from the finite integration interval corresponding to the finite amount of sample points.

This problem is fixed by the counter function that is determined based on the step response and is configured such that the error terms are canceled at least for a certain set of discrete frequencies.

In other words, the counter function cancels errors at least for the certain set of discrete frequencies, but does not alter the transform of the step response to frequency domain (i.e. the transfer function) otherwise.

Accordingly, information on the data dependent disturbances is obtained, which is free of errors from finite integration intervals in the transformation to frequency domain.

In some embodiments, information on data dependent disturbances due to the signal source is obtained, as the direct influence of the signal source is reflected in the transfer function.

Moreover, the signal analysis method according to the present disclosure allows for determining the step response and the transfer function without using a dedicated test signal. Instead, any input signal comprising a symbol sequence can be used, for example a random input signal.

Therein, the input signal may be established as a single ended signal or as a differential input signal, as the signal analysis method described above is suitable for both.

The modified step response may be transformed to frequency domain by a (Fast) Fourier transform.

According to an aspect of the present disclosure, the counter function is determined based on an asymptotic value of the step response. In general, the step response has a step-like shape, and approaches a fixed value for large times, namely the asymptotic value. Accordingly, the asymptotic value of the step response can be determined based on samples that are associated with large times (e.g., at the end of an acquisition time). Then, this asymptotic value is taken into account for determining the counter function such that the error terms of the transform to frequency domain are canceled out correctly.

According to another aspect of the present disclosure, the step response has a predetermined sample length, wherein the counter function is determined based on the sample length. In other words, the input signal is sampled over a finite sample time, such that only a finite amount of samples is available. The predetermined sample length may also be called acquisition time.

For example, a sample length of the counter function may be chosen to be equal to the predetermined sample length, such that the sampling intervals of the step response and of the counter function coincide.

In some embodiments, the predetermined sample length may be selectable by a user.

Of course, a longer sample length of the step response may be associated with a longer computation time. However, for a detailed step response analysis a larger predetermined sample length is beneficial. Accordingly, this corresponds to a tradeoff concerning duration and accuracy.

In general, the sample length should fulfill the following requirements:

the predetermined sample length should be longer than a channel memory being associated with the signal source; and a run length of a symbol pattern comprised in the input signal should be larger than the predetermined sample length.

In a further embodiment of the present disclosure, the modified step response is transformed over the sample length. As described above, samples of the input signal are only available over the predetermined sample length. Accordingly, the counter function or rather samples of the counter function corresponding to the individual samples of the step response are determined and added to the samples of the step response, thereby obtaining the modified step response. Thus, samples of the modified step response are available over the predetermined sample length. No finite-time error occurs when transforming the modified step response to frequency domain (at least for a certain set of frequencies), as these errors cancel between the transform of the step response and the transform of the counter function.

In some embodiments, the transfer function is evaluated only at predefined frequencies being associated with an inverse of the sample length. It has turned out that the transform of the modified step response to frequency domain is free of errors for frequencies being an integer multiple of the inverse of the sample length, i.e. for an integer multiple of the inverse of the sample time. By evaluating the transfer function only at these predefined frequencies, a transfer function free of errors is obtained.

The counter function may be established as a ramp function. In some embodiments, the counter function is established as a ramp function, wherein the ramp function has a value of 0 at a first time corresponding to a start of a sampling interval of the step response (i.e. at a point where the step response is also approximately equal to 0), and wherein the ramp function has a predefined negative value at a second time being associated with the end of the sampling interval of the step response. Therein, the predefined negative value may be equal to the negative of the asymptotic value of the step response. It has turned out that a counter function having the properties described above exactly cancels out the finite-time errors associated with the transformation to frequency domain at least for certain frequencies, for example for frequencies being an integer multiple of the inverse of the sample length.

According to an aspect of the present disclosure, the modified step response is transformed by a time discrete Fourier transform. Accordingly, the modified step response is transformed with respect to the available samples within the predetermined sampling interval. As a result, the transfer function depends on discrete frequencies being an integer multiple of the inverse of the overall sampling length, i.e. the overall sampling time. As already described above, the transfer function is free of errors at these discrete frequencies.

In a further embodiment of the present disclosure, at least one of a magnitude of the transfer function and a phase of the transfer function is determined. The magnitude of the transfer function and the phase of the transfer function may be associated with different disturbances in the input signal, for example with different sources of data dependent jitter in the input signal. Accordingly, additional information on the exact sources of data dependent jitter is provided.

For example, a frequency dependent attenuation of the transfer function is associated with dielectric losses. As a further example, a frequency dependent phase of the transfer function may be associated with a dispersion of the input signal due to individual components of the signal source.

According to another aspect of the present disclosure, at least one of a periodic jitter component of the input signal and a data dependent jitter component of the input signal is determined. In some embodiments, the data dependent jitter component may be determined based on the step response and/or based on the transfer function.

The periodic jitter component may be established as at least one of periodic vertical jitter, i.e., as jitter originating from an amplitude perturbation, or as periodic horizontal jitter, i.e., as jitter originating from a time perturbation.

In a further embodiment of the present disclosure, the at least one jitter component and the step response are determined jointly. For example, the step response associated with the data dependent jitter and the at least one periodic jitter component may be determined simultaneously instead of consecutively. In general, the accuracy of a joint determination of several parameters is better than the consecutive determination of these parameters. Thus, the accuracy of the determined step response and the periodic jitter component is enhanced by the joint determination.

The at least one determined jitter component and the transfer function may be plotted on a display. In some embodiments, a histogram of the at least one determined jitter component may be plotted on the display. Alternatively or additionally, a magnitude of the transfer function and/or a phase of the transfer function may be plotted on the display.

According to an aspect of the present disclosure, the input signal is PAM-N coded. Therein N is an integer bigger than 1. Accordingly, some embodiments of the signal analysis method are not limited to binary signals (PAM-2 coded) since any kind of pulse-amplitude modulated signals may be processed.

Embodiments of the present disclosure further provide a signal analysis module for analyzing a time-and-value discrete input signal being associated with a signal source. In an embodiment, the signal analysis module is configured to receive the input signal. The signal analysis module further is configured to determine at least one jitter component of the input signal. The signal analysis module further is configured to determine a step response based on the input signal, the step response being associated with at least the signal source. The signal analysis module further is configured to determine a counter function based on the step response, the counter function being configured to cancel error terms in a finite-time transform of the step response to frequency domain. The signal analysis module further is configured to superpose the step response and the counter function, thereby obtaining a modified step response. The signal analysis module further is configured to transform the modified step response to frequency domain, thereby obtaining a transfer function being associated with at least the signal source. In some embodiments, the signal analysis module includes one or more circuits for carrying out the functionality described above.

In some embodiments, the signal analysis module is configured to perform the signal analysis method described above.

Regarding the advantages and further properties of the signal analysis module, reference is made to the explanations given above with respect to the signal analysis method, which also hold for the signal analysis module and vice versa.

According to an aspect of the present disclosure, the signal analysis module is configured to determine the counter function based on an asymptotic value of the step response. In general, the step response has a step-like shape, and approaches a fixed value for large times, namely the asymptotic value. Accordingly, the asymptotic value of the step response can be determined based on samples that are associated with large times. Then, the signal analysis module may take into account the asymptotic value for determining the counter function, such that the errors of the transform to frequency domain are correctly canceled.

In a further embodiment of the present disclosure, the step response has a predetermined sample length, wherein the signal analysis module is configured to determine the counter function based on the sample length. In other words, the input signal is sampled over a finite sample time, such that only a finite amount of samples is available.

For example, a sample length of the counter function may be chosen to be equal to the predetermined sample length such that the sampling intervals of the step response and of the counter function coincide.

In some embodiments, the predetermined sample length may be selectable by a user.

According to another aspect of the present disclosure, the signal analysis module is configured to transform the modified step response over the sample length. As described above, samples of the input signal are only available over the predetermined sample length. Accordingly, the counter function or rather samples of the counter function corresponding to the individual samples of the step response are determined and added to the samples of the step response, thereby obtaining the modified step response. Thus, samples of the modified step response are available over the predetermined sample length. No finite-time error occurs when transforming the modified step response to frequency domain (at least for a certain set of frequencies), as these errors cancel between the transform of the step response and the transform of the counter function.

The signal analysis module may be configured to evaluate the transfer function only at predefined frequencies being associated with an inverse of the sample length. It has turned out that the transform of the modified step response to frequency domain is free of errors for frequencies being an integer multiple of the inverse of the sample length, i.e. for an integer multiple of the inverse of the sample time. By evaluating the transfer function only at these predefined frequencies, a transfer function free of errors is obtained.

According to another aspect of the present disclosure, the counter function is established as a ramp function. In some embodiments, the counter function is established as a ramp function having a value of 0 at a first time corresponding to a start of a sampling interval of the step response (i.e. at a point where the step response is also approximately equal to 0), and having a predefined negative value at a second time being associated with the end of the sampling interval of the step response. Therein, the predefined negative value may be equal to the negative of the asymptotic value of the step response. It has turned out that a counter function having the properties described above exactly cancels the finite-time errors being associated with the transformation to frequency domain at least for certain frequencies, for example for frequencies being an integer multiple of the inverse of the sample length.

In some embodiments, the signal analysis module is configured to determine at least one of a magnitude of the transfer function and a phase of the transfer function. The magnitude of the transfer function and the phase of the transfer function may be associated with different disturbances in the input signal, for example with different sources of data dependent jitter in the input signal. Accordingly, additional information on the exact sources of data dependent jitter is provided.

For example, a frequency dependent attenuation of the transfer function may be associated with dielectric losses. As a further example, a frequency dependent phase of the transfer function may be associated with a dispersion of the input signal due to individual components of the signal source.

In a further embodiment of the present disclosure, the signal analysis module is configured to determine the at least one jitter component and the step response jointly. For example, the step response being associated with the data dependent jitter and the at least one periodic jitter component may be determined simultaneously instead of consecutively. In general, the accuracy of a joint determination of several parameters is better than the consecutive determination of these parameters. Thus, the accuracy of the determined step response and the periodic jitter component is enhanced by the joint determination.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
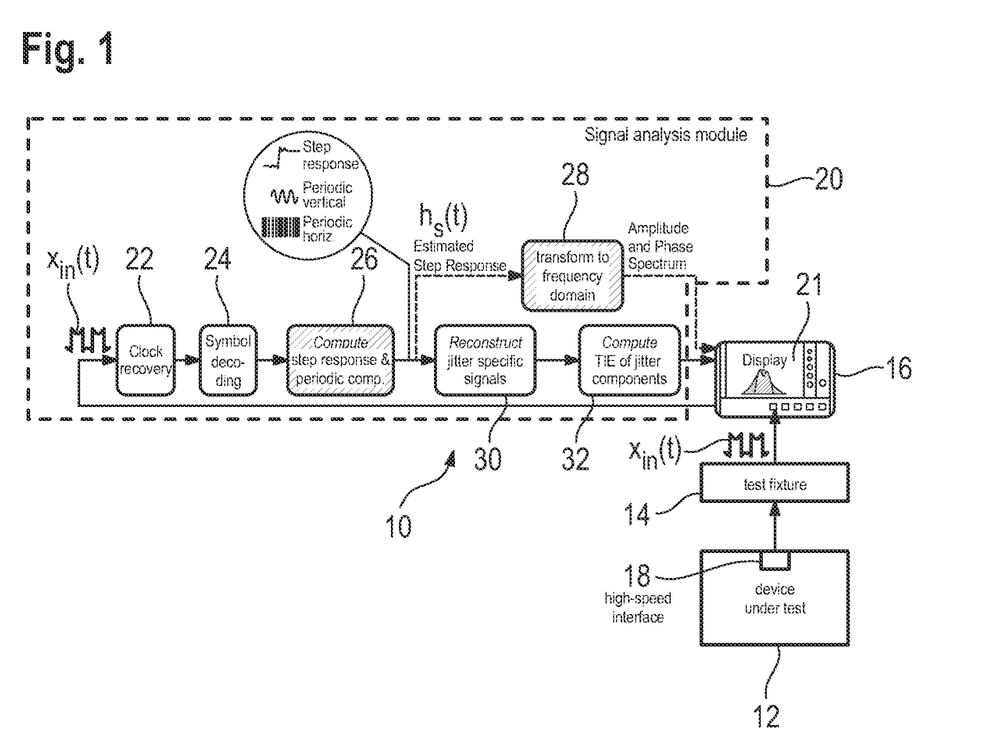
FIG. 1 schematically shows a block diagram of a measurement system with a signal analysis module according to an embodiment of the present disclosure.

FIG. 1 schematically shows a block diagram of a measurement system 10 comprising a device under test 12, a test fixture 14, and a measurement instrument 16.

The device under test 12 may be any electronic device being configured to generate, for example, a PAM-N coded signal having a high data rate, wherein N is an integer bigger than 1. Thus, the signal generated by the device under test 12 comprises a symbol sequence, wherein each symbol has one of N different values. In some embodiments, the device under test 12 may comprise a high-speed interface 18, for example a PCIe interface, a USB interface, a SATA interface, and/or a HDMI interface.

The measurement instrument 16 is established as a time-domain measurement device being configured to receive and process an input signal in time domain. For example, the measurement instrument 16 is established as an oscilloscope.

Usually, such time-domain measurement instruments do not comprise appropriate input interfaces in order to directly connect the device under test 12, or rather the high-speed interface 18 with the measurement instrument 16.

In order to connect the device under test 12 with the measurement instrument 16, the measurement system 10 comprises the test fixture 14 being configured to connect the high-speed interface 18 of the device under test 12 with the measurement instrument 16. The test fixture 14 may comprise suitable cables, adaptors, etc. in order to connect the high-speed interface 18 with the measurement instrument 16.

In the embodiment shown, the measurement instrument 16 comprises a signal analysis module 20 and a display 21. In FIG. 1, it is noted that the signal analysis module 20 is depicted outside of the measurement instrument 16 only for illustration purposes. Of course, the signal analysis module 20 is typically housed within the measurement instrument 16.

Therein and in the following, the term "module" is understood to describe suitable hardware, suitable software, or a combination of hardware and software that is configured to have a certain functionality. In some embodiments, the signal analysis module 20 includes one or more circuits (e.g., circuitry) for carrying out the methodology and technology described herein. For example, The hardware may, inter alia, comprise a CPU, a GPU, an FPGA, an ASIC, or other types of electronic circuitry being configured to perform the certain functionality.

In the embodiment shown, the signal analysis module 20 comprises a clock recovery circuit or module 22, a decoding circuit or module 24, a parameter estimation circuit or module 26, a transformation circuit or module 28, a reconstruction circuit or module 30, and a TIE circuit or module 32. The functionality of the individual modules will be described in more detail below.

In general, the measurement instrument 16, or rather the signal analysis module 20, is configured to perform a signal analysis method for analyzing a time-and-value-discrete input signal being associated with a signal source.

Therein the term "signal source" is understood to denote all components from the actual source generating the input signal (i.e. from the device under test 12) up to the signal analysis module 20. Thus, in the exemplary embodiment shown in FIG. 1, the term "signal source" is understood to comprise the device under test 12, the high-speed interface 18, and the test fixture 14.

More precisely, the signal analysis module 20 is configured to perform the signal analysis method that is described, for example, in the following in more detail with reference to FIG. 2.

A time-and-value discrete input signal $x_{in}(t)$ being generated by the device under test 12 is received via the high-speed interface 18 and the test fixture 14 (step S1).

The time-and-value discrete input signal $x_{in}(t)$ may be stored in a memory of the measurement instrument 16, and the subsequent steps described in the following may be performed based on the saved input signal $x_{in}(t)$.

Alternatively, the steps described in the following may be performed in real-time directly based on an analog input signal $x_{in}(t)$ received.

A clock data recovery is performed based on the received input signal $x_{in}(t)$ by the clock recovery module 22, thereby obtaining a clock signal underlying the input signal $x_{in}(t)$ (step S2). Therein, the clock recovery module 22 may employ any clock data recovery method(s) known from the state of the art.

Based on the recovered clock signal and based on the input signal, the input signal $x_{in}$ is decoded by the decoding module 24, thereby obtaining a decoded input signal (step S3). Therein, the decoding module 24 may employ any decoding method known from the state of the art.

For example, the decoding module 24 may compare a signal level of the input signal in the individual portions of the input signal $x_{in}(t)$ that are defined by the clock signal with several predetermined reference values in order to determine the symbol values of the input signal $x_{in}(t)$ in the respective portions defined by the clock signal.

Based on the decoded input signal, at least a step response $h_s(t)$ being associated with the signal source (i.e. with the device under test 12, the high-speed interface 18, and the test fixture 14) is determined or rather estimated by the parameter estimation module 26 (step S4).

Figure 3:
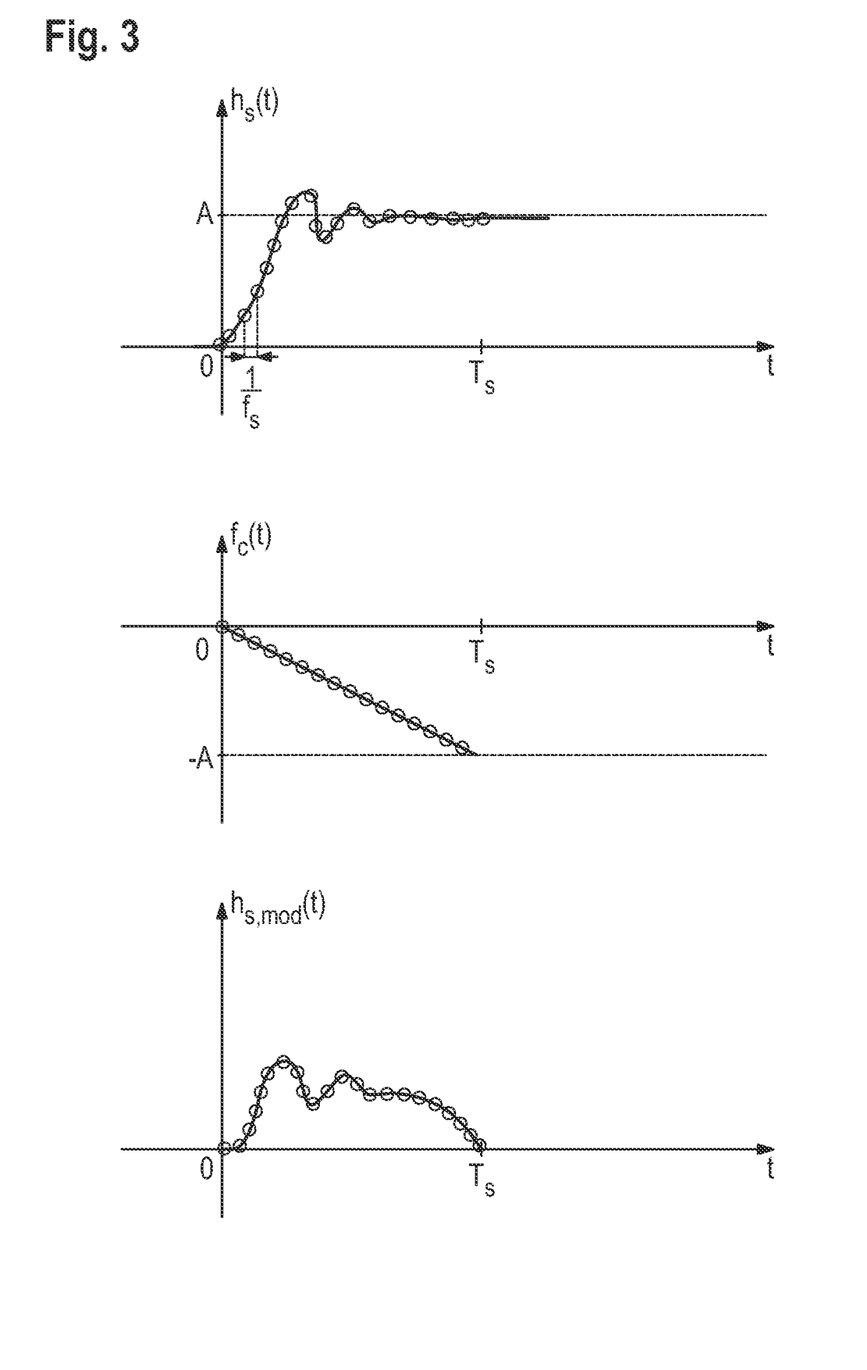
FIG. 3 shows a diagram of a step response, a diagram of a counter function, and a diagram of a modified step response plotted against time, respectively.

As is illustrated in the top diagram in FIG. 3, the step response $h_s(t)$ is determined based on a predetermined sample length $T_S$, wherein the predetermined sample length $T_S$ is the overall sample time, which may also be called acquisition time.

The predetermined sample length $T_S$ is equal to a predetermined number of samples n times the inverse of the sample rate $f_S$ of the parameter estimation module 26, i.e. $T_S = n/f_S$. In some embodiments, the predetermined sample length $T_S$ may be selectable by a user of the measurement instrument 16, e.g. via a suitable user interface of the measurement instrument 16.

Of course, a longer sample length $T_S$ of the step response may be associated with a longer computation time. However, for a detailed step response analysis (described below) a larger predetermined sample length $T_S$ is beneficial.

In general, the predetermined sample length $T_S$ should fulfill the following requirements: the predetermined sample length $T_S$ should be longer than a channel memory being associated with the signal source; and a run length of a symbol pattern comprised in the input signal $x_{in}(t)$ should be larger than the predetermined sample length $T_S$.

In FIG. 3, the individual samples of the estimated step response $h_s(t)$ are illustrated as circles. However, it is to be understood that the actual number of samples is much bigger than illustrated in FIG. 3. For example, the sample rate may be 40 GS/s, and the overall number of samples may be equal to 2 MS, resulting in an overall sample length (acquisition time) of 50 µs.

In order to enhance the precision of the estimated step response $h_s(t)$, the parameter estimation module 26 may estimate the step response $h_s(t)$ together with at least one periodic jitter component comprised in the input signal.

In some embodiments, the step response $h_s(t)$, a periodic vertical jitter component of the input signal $x_{in}(t)$, i.e. periodic jitter originating from an amplitude perturbation, and/or a periodic horizontal jitter component of the input signal $x_{in}(t)$, i.e. periodic jitter originating from a time perturbation, may be determined jointly by the parameter estimation module 26.

The joint determination of the step response $h_s(t)$ and of the periodic jitter components is described in detail in pending patent application U.S. Ser. No. 16/750,944, wherein the respective description concerning at least the joint determination is incorporated herewith in its entirety by reference.

In general, the transformation module 28 is configured to transform the estimated step response kW to frequency domain. However, as only a finite number of samples is available in a finite-time interval of length $T_S$, a straight-forward Fourier transform of the step response $h_s(t)$ would lead to large errors. Accordingly, a more sophisticated transform to frequency domain is performed by the transformation module 28.

Therefore, a counter function $f_c(t)$ is determined based on the estimated step response $h_c(t)$ (step S5). More precisely, the counter function $f_c(t)$ is determined based on the overall sample length $T_S$ of the step response $h_s(t)$, and based on an asymptotic value A of the step response $h_s(t)$ for large times t.

As is illustrated in the middle diagram of FIG. 3, the counter function $f_c(t)$ is constructed such that it has the same value as the estimated step response $h_s(t)$ at a left edge of the sampling interval (which is chosen to be t=0 in FIG. 3). Thus, it holds $f_c(t=0)=h_s(t=0)=0$. Moreover, the counter function $f_c(t)$ is constructed such that it has the negative value of the estimated step response $h_s(t)$ at a right edge of the sampling time interval, i.e. at $t=T_S$. Thus, it holds $f_c(t=T_S)=-h_s(t=T_S)=-A$. Between these two points at the edges of the sampling interval, the counter function $f_c(t)$ descends linearly. Thus, the counter function $f_c(t)$ is established as a ramp function.

The step response $h_s(t)$ and the counter function $f_c(t)$ are superposed, thereby obtaining a modified step response $h_{s,mod}(t)$ (step S6).

As is illustrated in the lower diagram of FIG. 3, the modified step response $h_{s,mod}(t)$ is equal to 0 at both edges of the sampling interval, i.e. at t=0 and at $t=T_S$, by construction.

The modified step response $h_{s,mod}(t)$ is transformed to frequency domain by a discrete Fourier transform, wherein the Fourier transform is performed over the time interval from t=0 to $t=T_S$, thereby obtaining a transfer function being associated with the signal source (step S7).

In other words, the modified step response $h_{s,mod}(t)$ is transformed over the sample length $T_S$ in order to obtain the transfer function.

The Fourier transform of the modified step response $h_{s,mod}(t)$ has the following important properties:

For certain frequencies being an integer multiple of the inverse sampling length, i.e. for $\omega_k=k\cdot\pi/T_S$, the (discrete) Fourier transform of the modified step response $h_{s,mod}(t)$ is equal to the exact Fourier transform of the step response $h_s(t)$, i.e. without errors due to the integration or rather the summation over a finite time interval.

The counter function $f_c(t)$ exactly cancels out the error terms that arise due to the finite summation interval at frequencies $\omega_k$. Therefore, the respective function is called counter function.

Thus, if the transfer function is evaluated only at the frequencies $\omega_k$, a transfer function without errors is obtained. However, this is generally not true for other values of the frequency.

The resulting transfer function is a complex function, having a frequency-dependent magnitude and a frequency-dependent phase. In general, the transfer function comprises information on data dependent disturbances that are associated with the signal source, for example information on data dependent jitter being associated with the signal source. Accordingly, the signal analysis method described above provides additional information on the influence of the signal source on the data dependent disturbances comprised in the input signal, for example on the data dependent jitter comprised in the input signal.

The magnitude of the transfer function and/or the phase of the transfer function may be determined based on the transfer function by the transformation module 28 (step S8).

The magnitude of the transfer function and the phase of the transfer function may be associated with different disturbances in the input signal, for example with different sources of data dependent jitter in the input signal. Accordingly, additional information on the exact sources of data dependent jitter is provided. For example, a frequency dependent attenuation of the transfer function may be associated with dielectric losses and/or with an attenuation due to the skin-effect. As a further example, a frequency dependent phase of the transfer function may be associated with a dispersion of the input signal due to individual components of the signal source.

Figure 4:
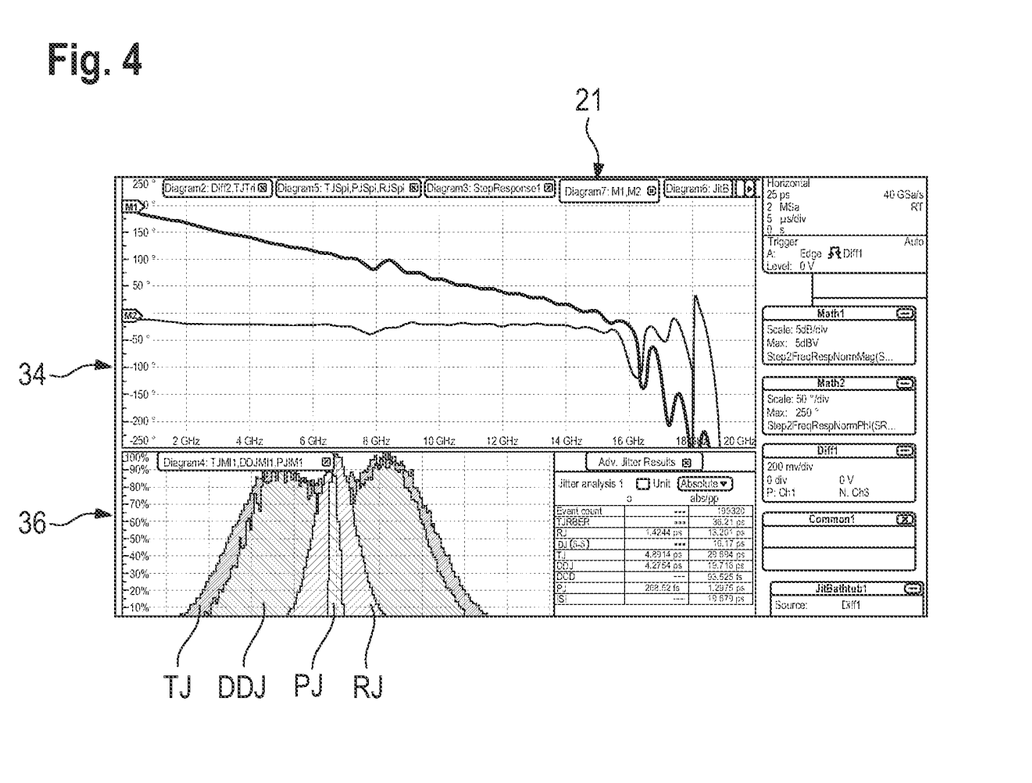
FIG. 4 shows a display of a measurement instrument of the measurement system of FIG. 1.

As is illustrated in FIG. 4, the transfer function, or rather the magnitude of the transfer function and/or the phase of the transfer function, may be plotted on the display 21 of the measurement instrument 16 (step S9).

Additionally, further jitter components may be reconstructed by the reconstruction module 30, the corresponding time interval errors (TIE) may be determined by the TIE module 32, and the corresponding histograms may be displayed on the display 21 (step S10).

In the specific example illustrated in FIG. 4, the magnitude of the transfer function (curve "Math 1") and the phase of the transfer function (curve "Math 2") are plotted in a first portion 34 of the display 21, while the histograms being associated with the individual determined jitter components are displayed in a second portion 36 of the display 21.

More precisely, the histograms being associated with the total jitter (TJ), the data dependent jitter (DDJ), the periodic jitter (PJ) and the random jitter (RJ) are displayed. However, it is to be understood that any other combination of jitter components may be displayed.

Alternatively or additionally, an eye diagram being associated with the input signal $x_{in}(t)$, and the influence of the individual jitter components on the eye diagram may be displayed on the display 21.

Summarizing, the signal analysis method described above provides various pieces of information on jitter comprised in the input signal, and for example on the influence of the signal source on the jitter components, for instance on the data dependent jitter.

In some embodiments, information on data dependent jitter due to the signal source is obtained, as the influence of the signal source is reflected in the transfer function.

Moreover, the signal analysis method described above allows for determining the step response $h_s$ (t) and the transfer function without dedicated test signal. Instead, any input signal comprising a symbol sequence can be used, for example a random input signal.

Figure 2:
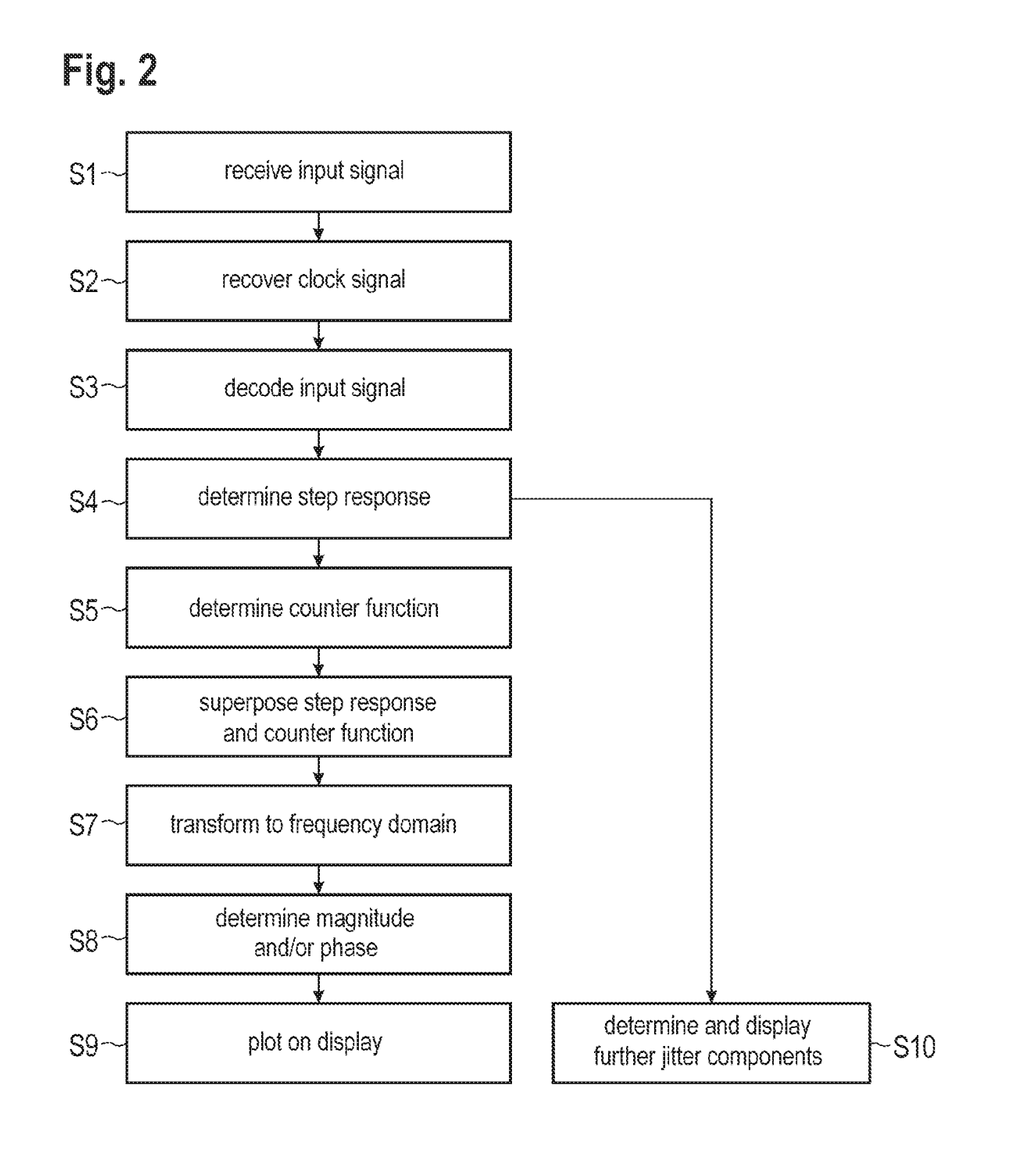
FIG. 2 shows a flow chart of a signal analysis method according to an embodiment of the present disclosure.

The measurement instrument 16 or the signal analysis module 20 is configured to perform the steps schematically shown, for example, in FIG. 2 in order to analyze the. In some embodiments, measurement instrument 16 includes one or more computer-readable media containing computer readable instructions embodied thereon that, when executed by one or more computer circuits (contained in or associated with the measurement instrument 16, the signal analysis module 20, etc.), cause the one or more computer circuits to perform one or more steps of the method of FIG. 2 described above. In some embodiments, the one or more computer circuits includes a microprocessor, a microcontroller, a central processing unit, a graphics processing unit (GPU), etc.

In some embodiments, the one or more computer-readable media contains computer readable instructions embodied thereon that, when executed by the one or more computer circuits, cause the one or more computer circuits to perform one or more steps of any of the methods of claims 1-11.

As described briefly above, certain embodiments disclosed herein utilize circuitry (e.g., one or more circuits) in order to implement protocols, methodologies or technologies disclosed herein, operably couple two or more components, generate information, process information, analyze information, store information, display information, generate signals, encode/decode signals, convert signals, transmit and/or receive signals, control other devices, etc. Circuitry of any type can be used. It will be appreciated that the term "information" can be use synonymously with the term "signals" in this paragraph.

In an embodiment, circuitry includes, among other things, one or more computing devices or computer circuits such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the functionality described herein can be implemented by special purpose hardware-based computer systems or circuits, etc., or combinations of special purpose hardware and computer instructions.

Of course, in some embodiments, two or more of the modules described above, or parts thereof, can be integrated or share hardware and/or software, circuitry, etc. In some embodiments, these components, or parts thereof, may be grouped in a single location or distributed over a wide area. In circumstances were the components are distributed, the components are accessible to each other via communication links.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The invention claimed is:

1. A signal analysis method, said signal analysis method comprising:
   receiving a time-and-value discrete input signal, said input signal being associated with a signal source;
   determining at least one jitter component of said input signal;
   determining a step response based on said input signal, said step response being associated with at least said signal source;
   determining a counter function based on said step response, said counter function being configured to cancel error terms in a finite-time transform of said step response to frequency domain;
   superposing said step response and said counter function, thereby obtaining a modified step response; and
   transforming said modified step response to frequency domain, thereby obtaining a transfer function being associated with at least said signal source,
   wherein the step response and the transfer function are determined without using a dedicated test signal.

2. The signal analysis method of claim 1, wherein said counter function is determined based on an asymptotic value of said step response.

3. The signal analysis method of claim 1, wherein said step response has a predetermined sample length, and wherein said counter function is determined based on said sample length.

4. The signal analysis method of claim 3, wherein said modified step response is transformed over said sample length.

5. The signal analysis method of claim 1, wherein said counter function is established as a ramp function.

6. The signal analysis method of claim 1, wherein said modified step response is transformed by a time discrete Fourier transform.

7. The signal analysis method of claim 1, wherein at least one of a magnitude of said transfer function and a phase of said transfer function is determined.

8. The signal analysis method of claim 1, wherein at least one of a periodic jitter component of said input signal and a data dependent jitter component of said input signal is determined.

9. The signal analysis method of claim 1, wherein said at least one jitter component and said step response are determined jointly.

10. The signal analysis method of claim 1, wherein said at least one determined jitter component and said transfer function are plotted on a display.

11. The signal analysis method of claim 1, wherein said input signal is PAM-N coded.

12. A signal analysis module for analyzing a time-and-value discrete input signal being associated with a signal source, comprising:
one or more circuits configured to:
receive said input signal;
determine at least one jitter component of said input signal;
determine a step response based on said input signal, said step response being associated with at least said signal source;
determine a counter function based on said step response, said counter function being configured to cancel error terms in a finite-time transform of said step response to frequency domain;
superpose said step response and said counter function, thereby obtaining a modified step response; and
transform said modified step response to frequency domain, thereby obtaining a transfer function being associated with at least said signal source.

13. The signal analysis module of claim 12, wherein said one or more circuits is configured to determine said counter function based on an asymptotic value of said step response.

14. The signal analysis module of claim 12, wherein said step response has a predetermined sample length, and wherein said one or more circuits is configured to determine said counter function based on said sample length.

15. The signal analysis module of claim 14, wherein said one or more circuits is configured to transform said modified step response over said sample length.

16. The signal analysis module of claim 14, wherein said one or more circuits is configured to evaluate said transfer function only at predefined frequencies being associated with an inverse of said sample length.

17. The signal analysis module of claim 12, wherein said counter function is established as a ramp function.

18. The signal analysis module of claim 12, wherein said one or more circuits is configured to determine at least one of a magnitude of said transfer function and a phase of said transfer function.

19. The signal analysis module of claim 12, wherein said one or more circuits is configured to determine said at least one jitter component and said step response jointly.

20. A non-transitory computer-readable media containing computer readable instructions stored thereon that, when executed by one or more computer circuits, cause the one or more computer circuits to perform steps of claim 1.

* * * * *